United States Patent
Lin et al.

(10) Patent No.: US 12,149,466 B2
(45) Date of Patent: Nov. 19, 2024

(54) SOUNDING REFERENCE SIGNAL SENDING METHOD AND RELATED APPARATUS

(71) Applicant: Huawei Technologies Co., Ltd., Shenzhen (CN)

(72) Inventors: Yan Lin, Shanghai (CN); Xiuyong Shen, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 496 days.

(21) Appl. No.: 17/514,693

(22) Filed: Oct. 29, 2021

(65) Prior Publication Data
US 2022/0052816 A1     Feb. 17, 2022

Related U.S. Application Data

(63) Continuation of application No. PCT/CN2019/085217, filed on Apr. 30, 2019.

(51) Int. Cl.
*H04L 5/00* (2006.01)
*H04B 1/408* (2015.01)

(52) U.S. Cl.
CPC .......... *H04L 5/0048* (2013.01); *H04B 1/408* (2013.01)

(58) Field of Classification Search
CPC . H04L 5/0012; H04L 5/0096; H04L 27/2613; H04B 1/408
See application file for complete search history.

(56) References Cited

U.S. PATENT DOCUMENTS

| 2012/0257582 A1 | 10/2012 | Damnjanovic et al. |
| 2013/0003890 A1 | 1/2013 | Schwent et al. |
| 2013/0010659 A1 | 1/2013 | Chen et al. |
| 2015/0055580 A1* | 2/2015 | Lim ............ H04W 52/325 370/329 |
| 2015/0215095 A1 | 7/2015 | Ahn et al. |
| 2017/0302419 A1 | 10/2017 | Liu et al. |

(Continued)

FOREIGN PATENT DOCUMENTS

| CN | 101772031 A | 7/2010 |
| CN | 102664684 A | 9/2012 |

(Continued)

OTHER PUBLICATIONS

Jeongho Jeon, "NR Wide Bandwidth Operations," IEEE Communications Magazine., vol. 56, No. 3, Mar. 1, 2018, XP055480198, 5 pages.

(Continued)

*Primary Examiner* — Yee F Lam

(74) *Attorney, Agent, or Firm* — Conley Rose, P.C.

(57) ABSTRACT

A method includes sequentially performing analog frequency conversion operations on a first digital frequency conversion signal and a second digital frequency conversion signal based on local oscillator signals at a same frequency, where the first digital frequency conversion signal corresponds to a first sounding reference signal (SRS) to be transmitted on a first carrier, and the second digital frequency conversion signal corresponds to a second SRS to be transmitted on a second carrier, transmitting the first SRS on the first carrier during a first time period, and transmitting the second SRS on the second carrier during a second time period, where the second time period is later than the first time period.

20 Claims, 8 Drawing Sheets

(56) References Cited

U.S. PATENT DOCUMENTS

| | | | |
|---|---|---|---|
| 2018/0241593 A1* | 8/2018 | Tirucherai Muralidharan | H04L 27/2649 |
| 2018/0359077 A1* | 12/2018 | Haine | H04B 7/0817 |
| 2019/0109688 A1* | 4/2019 | Kim | H04L 5/0048 |
| 2019/0174466 A1* | 6/2019 | Zhang | H04L 5/0057 |
| 2019/0281588 A1* | 9/2019 | Zhang | H04B 7/0617 |

FOREIGN PATENT DOCUMENTS

| | | |
|---|---|---|
| CN | 105099632 A | 11/2015 |
| CN | 103229448 B | 4/2016 |
| CN | 103814544 B | 4/2017 |
| CN | 106788927 A | 5/2017 |
| CN | 108024364 A | 5/2018 |
| CN | 108886457 A | 11/2018 |
| EP | 2727248 A1 | 5/2014 |
| EP | 1522151 B1 | 3/2016 |
| WO | 2017193827 A1 | 11/2017 |
| WO | 2017197086 A1 | 11/2017 |
| WO | 2017223196 A1 | 12/2017 |
| WO | 2018084917 A1 | 5/2018 |

OTHER PUBLICATIONS

3GPP TS 38.331 V15.5.1 (Apr. 2019), 3rd Generation Partnership Project;Technical Specification Group Radio Access Network; NR; Radio Resource Control (RRC) protocol specification (Release 15), 491 pages.

3GPP TS 38.214 V15.5.0 (Mar. 2019), 3rd Generation Partnership Project;Technical Specification Group Radio Access Network; NR; Physical layer procedures for data(Release 15), 103 pages.

3GPP TS 38.212 V15.5.0 (Mar. 2019), 3rd Generation Partnership Project;Technical Specification Group Radio Access Network; NR; Multiplexing and channel coding(Release 15), 101 pages.

3GPP TS 38.213 V15.5.0 (Mar. 2019), 3rd Generation Partnership Project;Technical Specification Group Radio Access Network; NR; Physical layer procedures for control(Release 15), 104 pages.

* cited by examiner

SOUNDING REFERENCE SIGNAL SENDING METHOD AND RELATED APPARATUS

CROSS-REFERENCE TO RELATED APPLICATIONS

This is a continuation of International Patent Application No. PCT/CN2019/085217 filed on Apr. 30, 2019, which is hereby incorporated by reference in its entirety.

TECHNICAL FIELD

This application relates to the field of wireless communications, and in particular, to a sounding reference signal (SRS) sending method and a related apparatus.

BACKGROUND

An SRS is an uplink reference signal, and is mainly used to estimate channel quality. After receiving an SRS from a terminal, a base station may estimate quality of an uplink channel from the terminal to the base station based on the SRS. For a time-division duplex (TDD) system, an SRS may also be used to estimate quality of a downlink channel from a base station to a terminal due to channel reciprocity. Based on the estimated channel quality, the base station can better schedule a radio resource, to improve system performance, such as a peak rate of a user and a system throughput.

In addition, a wireless communications system may further use a plurality of technical solutions, to further improve the system performance. One of the technical solutions is carrier aggregation (CA). Carrier aggregation means that two or more carriers are aggregated and data is simultaneously transmitted to a terminal or a base station on a plurality of carriers, to provide more transmission bandwidth. Another technical solution is carrier selection (CS). Data transmission between the terminal and the base station may be switched from one carrier to another carrier. Carrier selection is also sometimes referred to as carrier switching. Carrier selection can increase effective bandwidth for data transmission by selecting a carrier with better channel quality.

Further, the base station may configure, for the terminal, a carrier set including a plurality of carriers, and send downlink data on one or more of the carriers in a specific time period. In addition, the terminal may also need to send an SRS on the carriers, especially in a scenario in which channel reciprocity exists, for example, a scenario in which a TDD carrier exists, a scenario in which an unlicensed spectrum exists, or a scenario in which a high frequency spectrum exists. In this way, the base station can perform channel estimation on the carriers. A result of channel estimation may be used to select carriers for uplink or downlink data transmission, and to select a transmission parameter used for data transmission.

Due to limitations of software and hardware capabilities of the terminal, a limitation of a standard technical specification, or the like, the terminal may not simultaneously send an SRS on all carriers in the carrier set. In this scenario, the terminal may need to perform SRS carrier switching, to send the SRS on all the carriers. However, in an SRS carrier switching process, uplink and downlink data transmission of the terminal may be interrupted. Consequently, system performance is adversely affected.

SUMMARY

Embodiments of this application provide an SRS sending method and a related apparatus, to improve system performance, and/or reduce system costs.

It should be understood that in a solution provided in the embodiments of this application, a wireless communications apparatus may be a wireless communications device, or may be some components in a wireless communications device, for example, an integrated circuit product such as a system chip or a communications chip. The wireless communications device may be a computer device that supports a wireless communications function.

Further, the wireless communications device may be a terminal such as a smartphone, or may be a radio access network device such as a base station. The system chip may also be referred to as a system on chip (SoC), or an SoC chip. The communications chip may include a baseband processing chip and a radio frequency processing chip. The baseband processing chip is also sometimes referred to as a modem or a baseband chip. The radio frequency processing chip is also sometimes referred to as a radio frequency transceiver or a radio frequency chip. In physical implementation, some or all chips of the communications chip may be integrated into the SoC chip. For example, the baseband processing chip is integrated into the SoC chip, and the radio frequency processing chip is not integrated into the SoC chip.

According to a first aspect, a wireless communications apparatus is provided, including a local oscillator circuit, configured to output local oscillator signals, a digital frequency converter, configured to perform a digital frequency conversion operation on a to-be-transmitted signal, to obtain a digital frequency conversion signal, and output the digital frequency conversion signal, where the digital frequency conversion signal includes a first digital frequency conversion signal and a second digital frequency conversion signal, the first digital frequency conversion signal corresponds to a first SRS to be transmitted on a first carrier, and the second digital frequency conversion signal corresponds to a second SRS to be transmitted on a second carrier, and a frequency mixer respectively coupled to the local oscillator circuit and the digital frequency converter, configured to sequentially receive the first digital frequency conversion signal and the second digital frequency conversion signal, and respectively perform analog frequency conversion operations on the first digital frequency conversion signal and the second digital frequency conversion signal based on local oscillator signals at a same frequency that are provided by the local oscillator circuit, to transmit the first SRS on the first carrier in a first time period, and transmit the second SRS on the second carrier in a second time period, where the second time period is later than the first time period.

With reference to the first aspect, in an optional implementation, the local oscillator circuit, the digital frequency converter, and the frequency mixer may be integrated into a same integrated circuit chip (for example, a radio frequency chip). In another optional implementation, a baseband processor and the digital frequency converter are integrated into a same integrated circuit chip (for example, a baseband chip), and the local oscillator circuit and the frequency mixer are integrated into another integrated circuit chip (for example, a radio frequency chip). That the digital frequency converter is integrated into the radio frequency chip helps reduce data transmission overheads between the baseband chip and the radio frequency chip, and reduce power consumption.

According to a second aspect, a wireless communications apparatus is further provided. The wireless communications apparatus may be a wireless communications device, or may be a group of chips in a wireless communications device, for example, a radio frequency chip and a baseband chip. The wireless communications apparatus includes a radio frequency transceiver, a digital frequency converter, and a baseband processor, where the radio frequency transceiver is configured to provide an analog frequency conversion operation, the radio frequency transceiver includes at least one radio frequency transmit channel and at least one radio frequency receive channel, the digital frequency converter is configured to provide a digital frequency conversion operation, and the baseband processor is configured to provide a control signal required by the radio frequency transceiver and the digital frequency converter, so that the apparatus is enabled to receive indication information from a base station through the at least one radio frequency receive channel, where the indication information is used to indicate to sequentially send SRSs to the base station on a first carrier and a second carrier, and the SRSs include a first SRS corresponding to the first carrier and a second SRS corresponding to the second carrier, and first send the first SRS on the first carrier by using the digital frequency converter and one radio frequency transmit channel, and then send the second SRS on the second carrier by using the digital frequency converter and the radio frequency transmit channel, where the digital frequency conversion operation provided by the digital frequency converter is used to compensate for a frequency difference between the first carrier and the second carrier, so that local oscillator signals at a same frequency are shared by the analog frequency conversion operation provided by the radio frequency transmit channel.

With reference to technical solutions provided in the foregoing two aspects, in an optional implementation, that the digital frequency conversion operation provided by the digital frequency converter is used to compensate for a frequency difference between the first carrier and the second carrier may include a sum of a frequency of the first digital frequency conversion signal output by the digital frequency converter and a frequency of the local oscillator signal output by the local oscillator circuit is equal to a frequency of the first carrier, and a sum of a frequency of the second digital frequency conversion signal output by the digital frequency converter and the frequency of the local oscillator signal output by the local oscillator circuit is equal to a frequency of the second carrier.

According to a third aspect, a wireless communications apparatus is further provided. The wireless communications apparatus may be a wireless communications device, or may be a group of chips in a wireless communications device, for example, a radio frequency chip and a baseband chip. The wireless communications apparatus includes a radio frequency transceiver, a digital frequency converter, and a baseband processor, where the radio frequency transceiver is configured to provide an analog frequency conversion operation, the digital frequency converter is configured to provide a digital frequency conversion operation, and the baseband processor is configured to provide a control signal required by the radio frequency processor and the digital frequency converter, so that the apparatus is enabled to receive indication information from a base station, where the indication information is used to indicate to sequentially send SRSs to the base station on a first carrier and a second carrier, and the SRSs include a first SRS corresponding to the first carrier and a second SRS corresponding to the second carrier, perform a first digital frequency conversion operation and a first analog frequency conversion operation on the first SRS, and send the first SRS on the first carrier in a first time period, and perform a second digital frequency conversion operation and a second analog frequency conversion operation on the second SRS, and send the second SRS on the second carrier in a second time period, where the second time period is later than the first time period, the first digital frequency conversion operation and the second digital frequency conversion operation are used to compensate for a frequency difference between the first carrier and the second carrier, so that local oscillator signals at a same frequency are shared by the first analog frequency conversion operation and the second analog frequency conversion operation.

According to a fourth aspect, an SRS sending method is further provided. The method may be performed by the wireless communications apparatus in the foregoing solution, and the method includes receiving indication information from a base station, where the indication information is used to indicate to sequentially send SRSs to the base station on a first carrier and a second carrier, and the SRSs include a first SRS corresponding to the first carrier and a second SRS corresponding to the second carrier, performing a first digital frequency conversion operation and a first analog frequency conversion operation on the first SRS, and sending the first SRS on the first carrier in a first time period, and performing a second digital frequency conversion operation and a second analog frequency conversion operation on the second SRS, and sending the second SRS on the second carrier in a second time period, where the second time period is later than the first time period, the first digital frequency conversion operation and the second digital frequency conversion operation are used to compensate for a frequency difference between the first carrier and the second carrier, so that local oscillator signals at a same frequency are shared by the first analog frequency conversion operation and the second analog frequency conversion operation.

According to a fifth aspect, an SRS sending method is further provided. The method may be performed by the wireless communications apparatus in the foregoing solution, and the method includes sequentially performing analog frequency conversion operations on a first digital frequency conversion signal and a second digital frequency conversion signal based on local oscillator signals at a same frequency, where the first digital frequency conversion signal corresponds to a first SRS to be transmitted on a first carrier, and the second digital frequency conversion signal corresponds to a second SRS to be transmitted on a second carrier, and transmitting the first SRS on the first carrier in a first time period, and transmitting the second SRS on the second carrier in a second time period, where the second time period is later than the first time period, a sum of a frequency of the first digital frequency conversion signal and a frequency of the local oscillator signal is equal to a frequency of the first carrier, and a sum of a frequency of the second digital frequency conversion signal and the frequency of the local oscillator signal is equal to a frequency of the second carrier.

With reference to any one of the technical solutions provided in the foregoing aspects and the optional implementations of the aspects, in an optional implementation, the frequency of the local oscillator signal is between the frequency of the first carrier and the frequency of the second carrier. In addition, the first carrier and the second carrier may be located in a same frequency band. For example, both the first carrier and the second carrier are TDD carriers, and are configured for TDD intra-band contiguous downlink carrier aggregation. In this case, the frequency of the local oscillator signal may be equal to a center frequency of the downlink carrier aggregation of the first carrier and the second carrier. In another implementation, the first carrier and the second carrier may alternatively be located in different frequency bands. In this case, a higher capability (for example, a bandwidth processing capability) of the wireless communications apparatus may be required.

With reference to any one of the technical solutions provided in the foregoing aspects and the optional implementations of the aspects, in an optional implementation, both the first carrier and the second carrier are in a frequency range 2 of the 3rd Generation Partnership Project (3GPP) New Radio (NR) technical specification.

In this case, the analog frequency conversion operations performed on the first digital frequency conversion signal and the second digital frequency conversion signal may include analog up-conversion operations of two stages, the local oscillator signals include a first local oscillator signal and a second local oscillator signal, the first local oscillator signal is used for a first-stage analog up-conversion operation, and the second local oscillator signal is used for a second-stage analog up-conversion operation.

The local oscillator circuit may include a first local oscillator and a second local oscillator, and the frequency mixer includes a first frequency mixer and a second frequency mixer. The first frequency mixer is configured to sequentially receive the first digital frequency conversion signal and the second digital frequency conversion signal, respectively perform first up-conversion operations on the first digital frequency conversion signal and the second digital frequency conversion signal based on the local oscillator signals at the same frequency that are provided by the first local oscillator, to obtain a first intermediate frequency signal and a second intermediate frequency signal, and output the first intermediate frequency signal and the second intermediate frequency signal to the second frequency mixer. The second frequency mixer is configured to sequentially receive the first intermediate frequency signal and the second intermediate frequency signal, and respectively perform second up-conversion operations on the first intermediate frequency signal and the second intermediate frequency signal based on local oscillator signals at a same frequency that are provided by the second local oscillator, to transmit the first SRS on the first carrier in the first time period, and transmit the second SRS on the second carrier in the second time period.

With reference to any one of the technical solutions provided in the foregoing aspects and the optional implementations of the aspects, in an optional implementation, the apparatus may further receive the indication information from the base station, where the indication information is used to indicate the first carrier on which the first SRS is transmitted and the first time period, and the second carrier on which the second SRS is transmitted and the second time period.

According to a sixth aspect, an SRS sending apparatus is provided. The apparatus may also be the foregoing wireless communications apparatus. The apparatus may include a storage unit, configured to store program instructions, and a processing unit, configured to execute the program instructions in the storage unit, to implement any SRS sending method in the foregoing plurality of technical solutions.

The storage unit may be a memory, for example, a volatile memory, configured to cache the program instructions. The program instructions may be loaded into the storage unit from another non-volatile memory when the data scheduling method is performed. It is clear that the storage unit may alternatively be a non-volatile memory, and may be integrated into a chip. The processing unit may be a processor, for example, one or more processing cores of the chip.

According to a seventh aspect, an SRS sending apparatus is provided. The apparatus may be a wireless communications apparatus, for example, a communications chip. The apparatus may include a processor and an interface circuit. The processor is coupled to a memory by using the interface circuit, and the processor is configured to execute program code in the memory, to implement any SRS sending method in the foregoing plurality of technical solutions. The memory may be a non-volatile memory other than the communications chip.

According to an eighth aspect, a computer-readable storage medium is provided. The computer-readable storage medium stores program code, and when the program code is executed by a computer or a processor, any SRS sending method in the foregoing plurality of technical solutions is implemented.

According to a ninth aspect, a computer program product is provided. When program code included in the computer program product is executed by a computer or a processor, any SRS sending method in the foregoing plurality of technical solutions is implemented.

It should be understood that in comparison with a solution in which a frequency of a local oscillator signal is adjusted, because the frequency of the local oscillator signal does not need to be adjusted, and time required for digital frequency conversion is relatively short, the technical solutions provided in the foregoing aspects and the optional implementations of the foregoing aspects can reduce radio frequency retuning time required for SRS carrier switching, to improve performance of the wireless communications system.

According to a tenth aspect, a radio frequency transmitter is further provided, including a radio frequency receive channel, configured to receive indication information from a base station, where the indication information is used to indicate to send a first SRS on a first carrier in a first time period, and send a second SRS on a second carrier in a second time period, where the second time period is later than the first time period, and a frequency of the second carrier is different from a frequency of the first carrier, a first local oscillator, configured to output a first local oscillator signal required for a frequency mixing operation performed on the first SRS before the first time period, where a frequency of the first local oscillator signal is equal to the frequency of the first carrier, a second local oscillator, configured to output a second local oscillator signal required for a frequency mixing operation performed on the second SRS before the second time period, where a frequency of the second local oscillator signal is equal to the frequency of the second carrier, and the second local oscillator is different from the first local oscillator, and a radio frequency transmit channel separately coupled to the first local oscillator and the second local oscillator, configured to receive the first local oscillator signal provided by the first local oscillator before the first time period, and send the first SRS on the first carrier in the first time period, and receive the second local oscillator signal provided by the second local oscillator before the second time period, and send the second SRS on the second carrier in the second time period.

With reference to the technical solution provided in the tenth aspect, the radio frequency transmit channel may further include a frequency mixer. In an optional implementation, the frequency mixer is separately coupled to the first local oscillator and the second local oscillator by using a single-pole multiple-throw switch. In another optional implementation, the frequency mixer is separately coupled to the first local oscillator and the second local oscillator by using a multiplexer. In addition, in an optional implementation, the frequency mixer, the first local oscillator, and the second local oscillator are all disposed in the radio frequency transmit channel. In another optional implementation, the frequency mixer and the first local oscillator are disposed in the radio frequency transmit channel, and the second local oscillator is disposed in the radio frequency receive channel.

It should be understood that in comparison with a solution in which a frequency of a same local oscillator is adjusted, because a plurality of local oscillators provides different local oscillator signals for a same radio frequency transmit channel, the technical solution provided in the tenth aspect and the optional implementations of the tenth aspect can reduce radio frequency retuning time required for SRS carrier switching, to improve performance of a wireless communications system.

Figure 1:
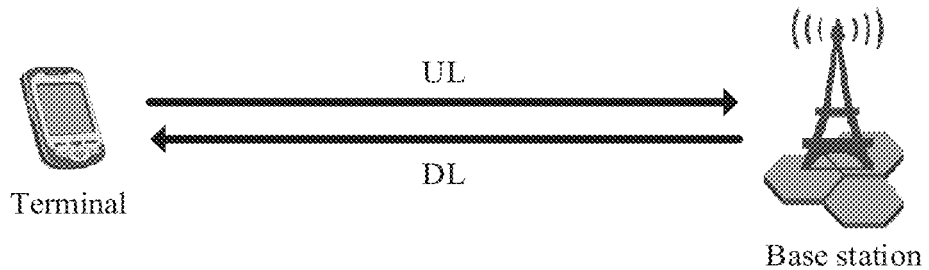
FIG. 1 is a schematic diagram of a structure of a wireless communications system according to an embodiment of this application.

It should be understood that, in the foregoing schematic diagrams, sizes and forms of block diagrams are for reference only, and should not constitute an exclusive interpretation of embodiments of this application. Relative locations and inclusion relationships between the block diagrams shown in the schematic structural diagrams are merely used to schematically represent structural associations between the block diagrams, rather than limiting a physical connection manner in the embodiments of this application.

DESCRIPTION OF EMBODIMENTS

The following further describes technical solutions provided in this application with reference to embodiments and accompanying drawings. It should be understood that a system structure and a service scenario provided in the embodiments of this application are mainly intended to explain some possible implementations of the technical solutions in this application, and should not be construed as a unique limitation on the technical solutions in this application. A person of ordinary skill in the art may know that as a system evolves and a new service scenario emerges, the technical solutions provided in this application are also applicable to a same or similar technical problem.

It should be understood that the technical solutions in the embodiments of this application include an SRS sending method and a related apparatus. Principles for resolving problems by using the technical solutions are the same or similar. In description in the following specific embodiments, although same content may not be repeated, it should be considered that the specific embodiments are mutually referenced and may be combined with each other.

In a wireless communications system, devices may be classified into devices that provide a wireless network service and devices that use the wireless network service. The devices that provide a wireless network service are devices that form a wireless communications network, and may be briefly referred to as network devices or network elements. The network devices usually belong to operators (for example, CHINA MOBILE and VODAFONE) or infrastructure providers (for example, CHINA TOWER), and are operated or maintained by these vendors. The network devices may further be classified into a radio access network (RAN) device and a core network (CN) device. The RAN device typically includes a base station (BS).

It should be understood that the base station may also sometimes be referred to as a wireless access point (AP) or a transmission reception point (TRP). Further, the base station may be a universal NodeB (gNB) in a fifth generation (5G) NR system or an evolved NodeB (eNB) in a fourth generation (4G) Long-Term Evolution (LTE) system. Base stations may be classified into a macro base station or a micro base station based on different physical forms or transmit power of the base stations. The micro base station is also sometimes referred to as a small base station or a small cell.

The devices that use the wireless network service are usually located on an edge of a network, and may be briefly referred to as terminals. The terminal can establish a connection to the network device, and provide a specific wireless communications service for a user based on a service of the network device. It should be understood that, because the terminal has a closer relationship with the user, the terminal is also sometimes referred to as user equipment (UE) or a subscriber unit (SU). In addition, compared with the base station that is usually placed at a fixed location, the terminal usually moves along with the user, and is also sometimes referred to as a mobile station (MS). In addition, some network devices such as a relay node (RN) or a wireless router may also sometimes be considered as terminals because the network devices have a UE identity or belong to the user.

Further, the terminal may include a mobile phone, a tablet computer, a laptop computer, a wearable device (for example, a smartwatch, a smart band, a smart helmet, or smart glasses), other devices that have a wireless access capability, for example, an intelligent vehicle, various Internet of Things (IoT) devices including various smart home devices (such as a smart meter and a smart home appliance) and smart city devices (such as a security or monitoring device and an intelligent transportation facility), and the like.

For ease of description, the technical solutions in the embodiments of this application are described in detail by using a base station and a terminal as an example in this application.

FIG. 1 is a schematic diagram of a structure of a wireless communications system according to an embodiment of this application. As shown in FIG. 1, the wireless communications system includes a terminal and a base station. Based on different transmission directions, a transmission link from the terminal to the base station is referred to as an uplink (UL), and a transmission link from the base station to the terminal is referred to as a downlink (DL). Similarly, data transmission over the uplink may be briefly referred to as uplink data transmission or uplink transmission, and data transmission over the downlink may be briefly referred to as downlink data transmission or downlink transmission.

In the wireless communications system, the base station may provide communications coverage for a specific geographical area by using an integrated or external antenna device. One or more terminals in the communications coverage of the base station may be connected to the base station. One base station may manage one or more cells. Each cell has one identity. The identity is also referred to as a cell identifier (cell ID). From a perspective of a radio resource, a cell is a combination of a downlink radio resource and an uplink radio resource (optional) that is paired with the downlink radio resource.

It should be understood that the wireless communications system may comply with a wireless communications standard in the 3GPP, or may comply with another wireless communications standard, for example, a wireless communications standard in the 802 series (for example, 802.11, 802.15, or 802.20) of the Institute of Electrical and Electronics Engineers (IEEE). Although FIG. 1 shows only one base station and one terminal, the wireless communications system may alternatively include other quantities of terminals and base stations. In addition, the wireless communications system may further include another network device, for example, a core network device.

The terminal and the base station should know configurations predefined by the wireless communications system, including a radio access technology (RAT) supported by the system and a configuration of a radio resource stipulated by the system, for example, a radio frequency band and a basic configuration of a carrier. The carrier is a frequency range that complies with a stipulation of the system. The frequency range may be determined jointly based on a center frequency of the carrier (denoted as a carrier frequency) and bandwidth of the carrier. The configurations predefined by the system may be used as a part of a standard protocol for the wireless communications system, or may be determined through interaction between the terminal and the base station. Content of a related standard protocol may be prestored in memories of the terminal and the base station, or reflected as hardware circuits or software code of the terminal and the base station.

In the wireless communications system, the terminal and the base station each support one or more same RATs, for example, 5G NR, 4G LTE, or a RAT for a future evolved system. Further, the terminal and the base station each use a same air interface parameter, a same coding scheme, a same modulation scheme, and the like, and communicate with each other based on the radio resource stipulated by the system.

Figure 2:
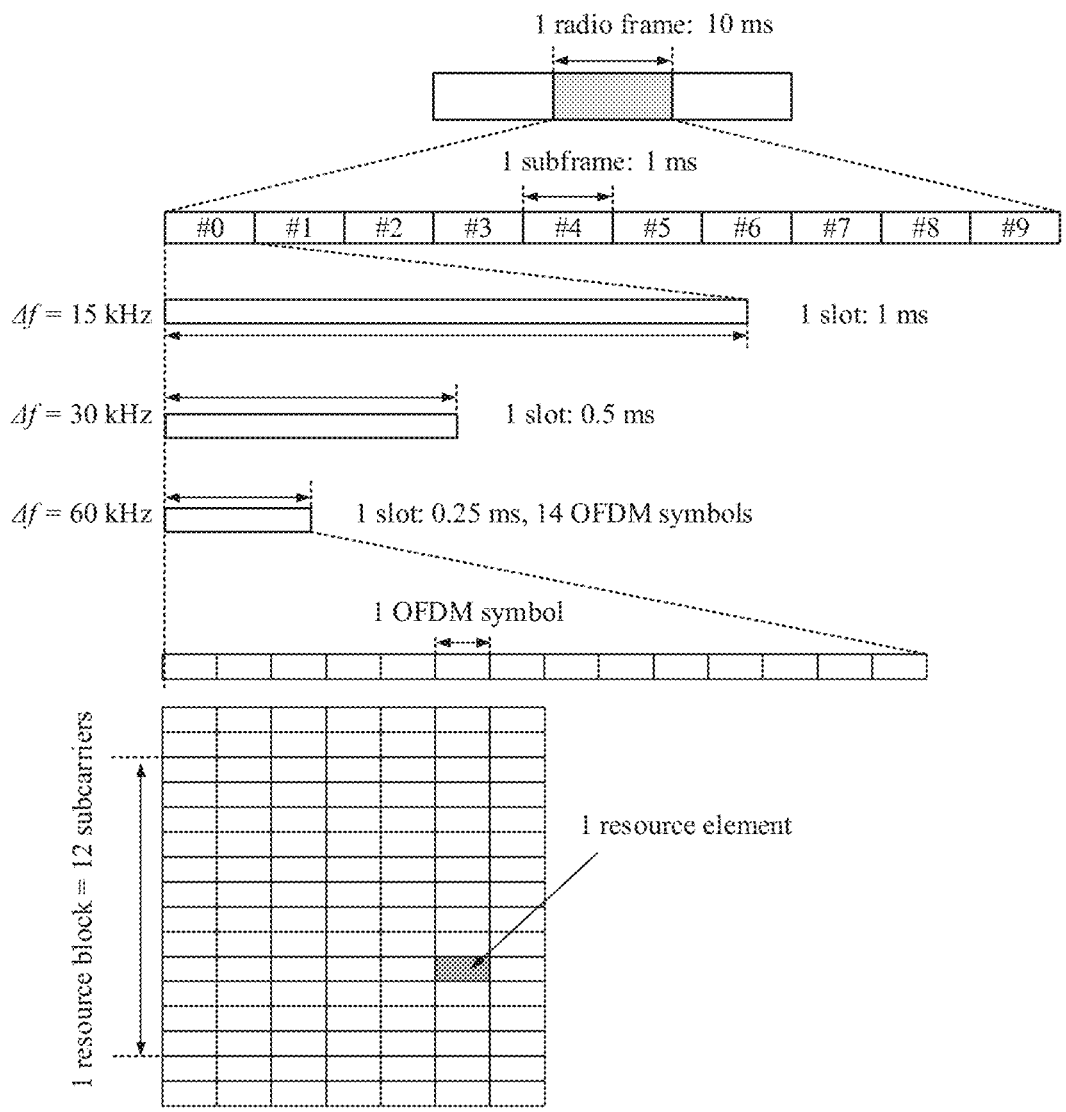
FIG. 2 is a schematic diagram of a radio resource according to an embodiment of this application.

FIG. 2 is a schematic diagram of a radio resource according to an embodiment of this application. FIG. 2 shows a time-frequency resource grid supported by a wireless communications system. The time-frequency resource grid may correspond to one or more carriers. It should be understood that different carriers may correspond to different time-frequency resource grids. For a frequency division duplex (FDD) system, a carrier used for uplink transmission and a carrier used for downlink transmission are different carriers, and may correspond to different time-frequency resource grids. For a TDD system, one carrier may correspond to one time-frequency resource grid, some time-frequency resources may be used for uplink transmission, and some time-frequency resources may be used for downlink transmission.

In the time-frequency resource grid shown in FIG. 2, a unit of a time resource is one orthogonal frequency-division multiplexing (OFDM) symbol, and a unit of a frequency resource is one subcarrier (SC). A minimum grid in the time-frequency resource grid corresponds to one OFDM symbol and one subcarrier, and is referred to as a resource element (RE) in a 3GPP technical specification.

An NR system is used as an example. A frequency domain resource used for NR transmission (including uplink transmission and downlink transmission) is divided into a plurality of subcarriers. Twelve consecutive subcarriers may be denoted as one resource block (RB). A time domain resource used for NR transmission is divided into a plurality of radio frames (frame) whose duration is 10 milliseconds (ms). Each radio frame may be evenly divided into 10 subframes whose duration is 1 ms. Each subframe is further divided into a plurality of slots. Each slot includes 14 consecutive OFDM symbols. Different subcarrier spacings (denoted as $\Delta f$) correspond to different OFDM symbol lengths. Therefore, for subcarrier spacings with different values, a time length of one slot is also different.

Figure 3:
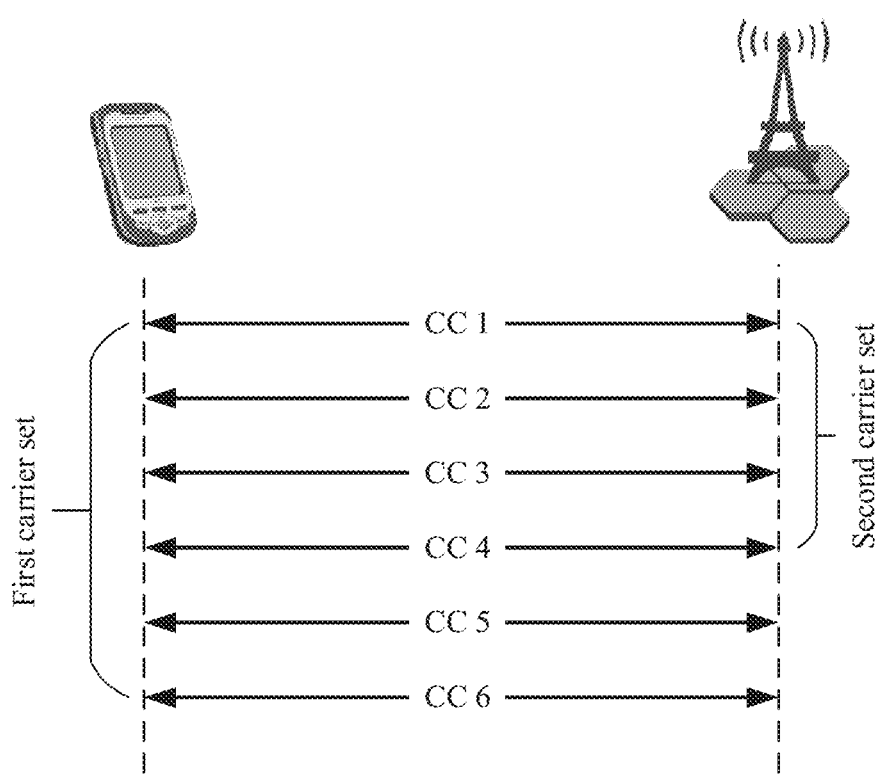
FIG. 3 is a schematic diagram of a configuration of a carrier of a wireless communications system according to an embodiment of this application.

FIG. 3 is a schematic diagram of a configuration of a carrier of a wireless communications system according to an embodiment of this application. In the wireless communications system, a base station configures two carrier sets for a terminal, and the two carrier sets are respectively denoted as a first carrier set and a second carrier set. The first carrier set may be used for downlink carrier aggregation, and the second carrier set may be used for uplink carrier aggregation. Carriers included in the two carrier sets may be partially the same, or may be all the same.

As shown in FIG. 3, the first carrier set includes six component carriers (CC), which are successively denoted as CC 1 to CC 6. The second carrier set includes four component carriers, including CC 1 to CC 4. It should be understood that quantities of CCs included in the first carrier set and the second carrier set are merely an example. In this embodiment of this application, the first carrier set and the second carrier set may alternatively include other quantities of CCs. The CCs may be consecutive or inconsecutive in frequency domain. Different CCs may be in a same frequency band, and may correspond to intra-band carrier aggregation (CA). Alternatively, different CCs may be in different frequency bands, and may correspond to inter-band CA.

It should be understood that in this application, one component carrier may correspond to one serving cell of the terminal. In a Chinese context, the component carrier is also translated as a component carrier, and may be briefly referred to as a carrier, and the serving cell may be briefly referred to as a cell. Unless otherwise specified, in this application, terms "carrier", "component carrier", "aggregated carrier", "aggregated component carrier", "serving cell", "cell", "one of a PCell or an SCell", and "one of a PCC or an SCC" may be used interchangeably.

The second carrier set configured by the base station for the terminal includes four CCs. However, the terminal cannot simultaneously send an SRS on the four CCs, and an SRS switching operation needs to be performed. The SRS switching operation is also sometimes referred to as SRS carrier switching, SRS switching, or carrier switching. For example, the terminal may first send data or an SRS on a first CC, then switch to a second CC, and finally send the SRS on the second CC. In a process of switching from the first CC to the second CC, data transmission on the first CC may be interrupted. Longer data transmission interruption time causes greater impact on system performance. Therefore, it is necessary to reduce the data transmission interruption time caused by the SRS switching operation.

Figure 4:
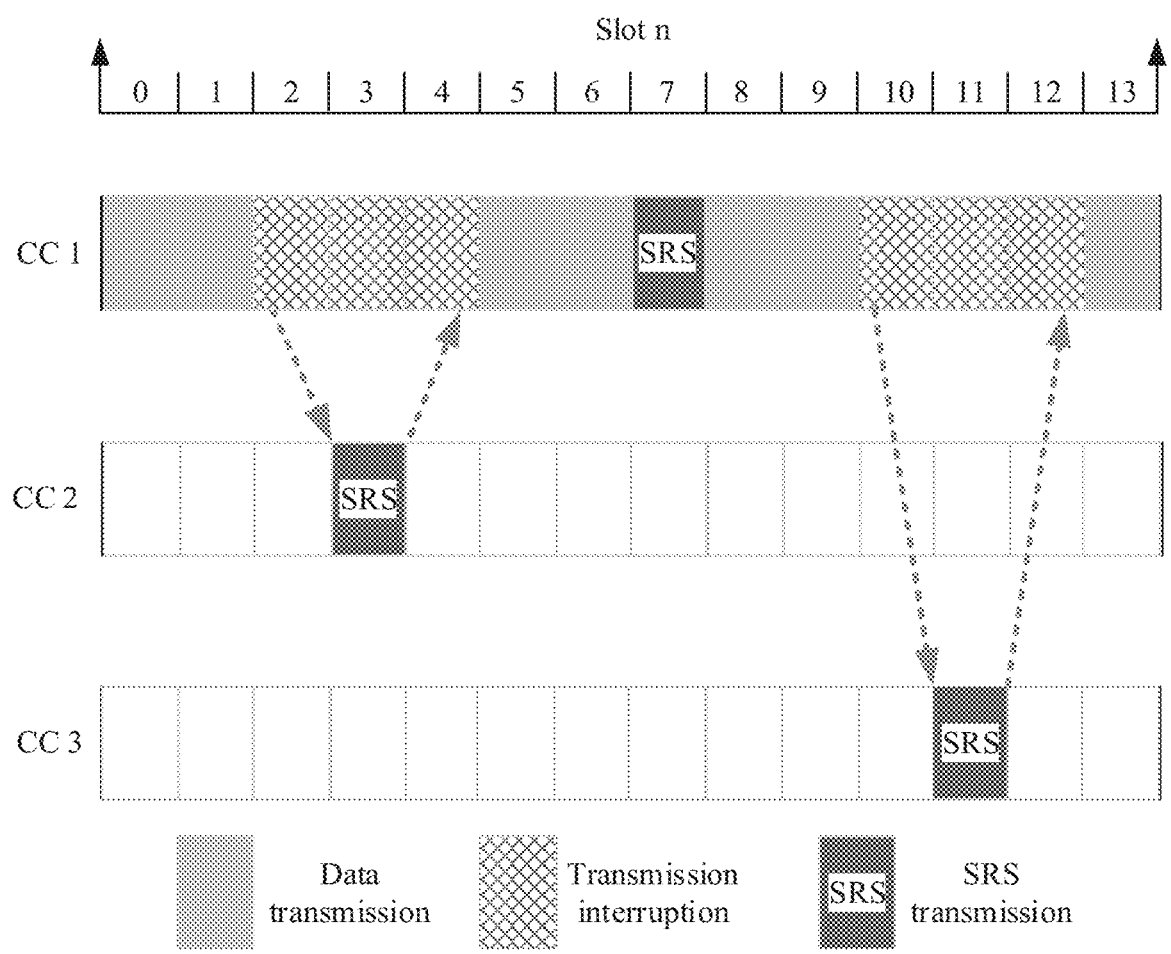
FIG. 4 is a schematic flowchart of an SRS switching operation according to an embodiment of this application.

FIG. 4 is a schematic flowchart of an SRS switching operation according to an embodiment of this application. FIG. 4 shows an example in which a terminal performs the SRS switching operation between three carriers in one slot. As shown in FIG. 4, one slot may include 14 OFDM symbols, which are respectively denoted as a symbol 0 to a symbol 13. First, the terminal sends data on a CC 1 in the symbol 0 and the symbol 1. Then, the terminal switches to a CC 2 in the symbol 2, and sends an SRS on the CC 2 in the symbol 3. Then, the terminal switches back to the CC 1 in the symbol 4, and sends the data and the SRS on the CC 1 in the symbol 5 to the symbol 9. Then, the terminal switches to a CC 3 in the symbol 10, and sends the SRS on the CC 3 in the symbol 11. Finally, the terminal switches back to the CC 1 in the symbol 12, and sends the data on the CC 1 in the symbol 13.

In the example in FIG. 4, it is assumed that the terminal sends the data and the SRS through a same radio frequency transmit channel. When the terminal sends the data or the SRS on the CC 1, the radio frequency transmit channel needs to adapt to a frequency of the CC 1. When the terminal separately switches to the CC 2 or the CC 3, the radio frequency transmit channel also needs to separately adapt to a frequency of the CC 2 and a frequency of the CC 3. Because the frequencies of the CC 1, the CC 2, and the CC 3 are different, it takes specific time to readjust a frequency to which the radio frequency transmit channel of the terminal is adapted from one frequency to another frequency, and the time may be denoted as radio frequency readjusting time or radio frequency (RF) retuning time. It should be understood that in this application, the radio frequency retuning time may also be referred to as an RF retuning delay or an RF retuning gap.

As shown in FIG. 4, data transmission on the CC 1 is used as an example. In an SRS switching process, data transmission may be interrupted. As described above, data transmission interruption time includes radio frequency retuning time. Therefore, reducing the radio frequency retuning time may reduce the data transmission interruption time, and help improve system performance. The radio frequency retuning time is related to software and hardware configurations of the terminal, especially radio frequency processing software and hardware configurations of the terminal.

Figure 5:
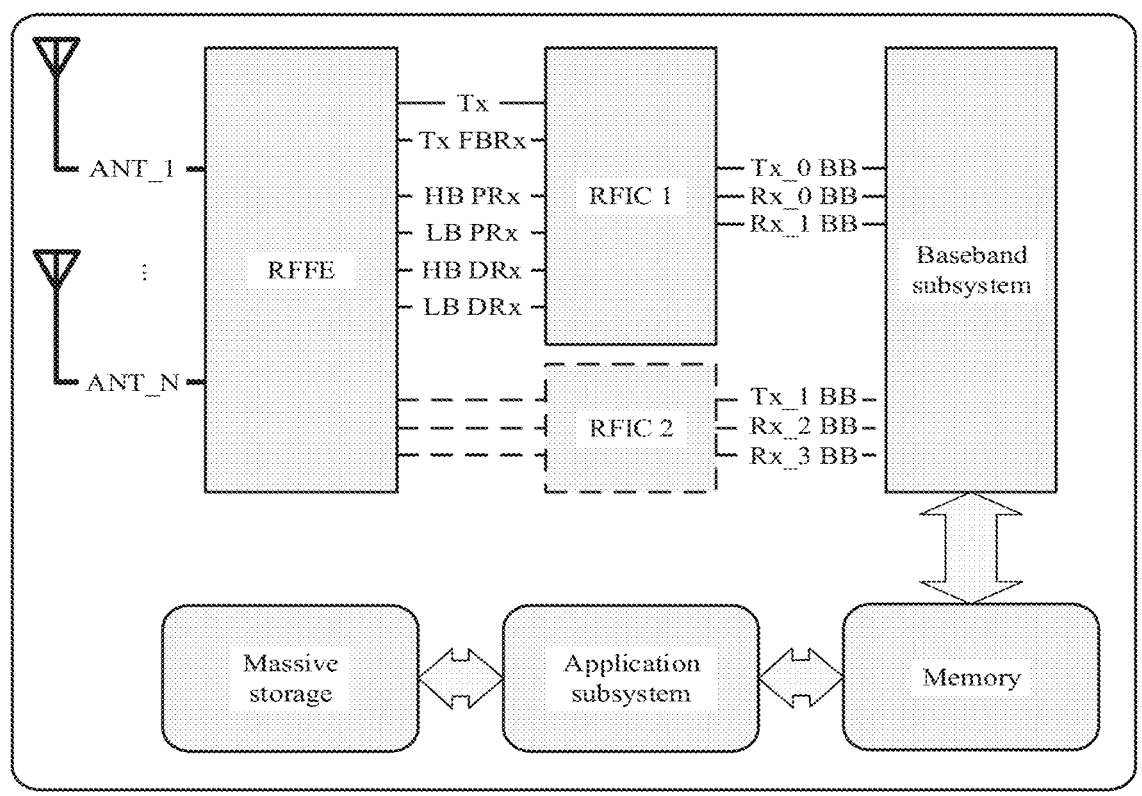
FIG. 5 is a schematic diagram of a structure of a wireless communications device according to an embodiment of this application.

FIG. 5 is a schematic diagram of a structure of a wireless communications device according to an embodiment of this application. The wireless communications device may be the terminal or the base station in the embodiments of this application. As shown in FIG. 5, the wireless communications device may include an application subsystem, a memory, massive storage, a baseband subsystem, an RF integrated circuit (RFIC), an RF front end (RFFE) component, and an antenna (ANT). The components may be coupled to each other by using various interconnection buses or in other electrical connection manners.

In FIG. 5, ANT_1 represents a first antenna, ANT_N represents an $N^{th}$ antenna, and N is a positive integer greater than 1. Tx represents a transmit path, and Rx represents a receive path. Different numbers represent different paths. FBRx represents a feedback receive path, PRx represents a primary receive path, and DRx represents a diversity receive path. HB represents a high band, LB represents a low band, and HB or LB indicates that a band is comparatively high or low. BB represents a baseband. It should be understood that marks and components in FIG. 5 are merely used for illustration, and merely used as a possible implementation. This embodiment of this application further includes another implementation.

The application subsystem may be used as a main control system or a main computing system of the wireless communications device, and is configured to run a main operating system and an application program, manage software and hardware resources of the entire wireless communications device, and provide a user operation interface for a user. The application subsystem may include one or more processing cores. In addition, the application subsystem may further include driver software related to another subsystem (for example, a baseband subsystem). The baseband subsystem may also include one or more processing cores, a hardware accelerator (HAC), a cache, and the like.

In FIG. 5, the RFFE component and an RFIC 1 (and an optional RFIC 2) may jointly form a radio frequency subsystem. The radio frequency subsystem may further be divided into an RF receive channel (or RF receive path) and an RF transmit channel (or RF transmit path). The radio frequency receive channel may receive an RF signal through the antenna, perform processing (such as amplification, filtering, and down-conversion) on the radio frequency signal to obtain a baseband signal, and transfer the baseband signal to the baseband subsystem. The radio frequency transmit channel may receive a baseband signal from the baseband subsystem, perform radio frequency processing (such as up-conversion, amplification, and filtering) on the baseband signal to obtain a radio frequency signal, and finally radiate the radio frequency signal into space through the antenna. Further, the radio frequency subsystem may include electronic components such as an antenna switch, an antenna tuner, a low-noise amplifier (LNA), a power amplifier (PA), a frequency mixer, a local oscillator (LO), and a filter. These electronic components may be integrated into one or more chips based on a requirement. The antenna may also sometimes be considered as a part of the radio frequency subsystem.

The baseband subsystem may extract useful information or data bits from a baseband signal, or convert information or data bits into a to-be-sent baseband signal. The information or data bits may be data that represents user data or control information such as a voice, a text, or a video. For example, the baseband subsystem may implement modulation and demodulation, coding and decoding, and other signal processing operations. Different radio access technologies, such as 5G NR and 4G LTE, usually have different baseband signal processing operations. Therefore, the baseband subsystem may include a plurality of processing cores or a plurality of HACs, to support convergence of a plurality of mobile communications modes.

In addition, because the radio frequency signal is an analog signal, and the baseband subsystem mainly processes a digital signal, an analog-to-digital conversion component is further required in the wireless communications device.

The analog-to-digital conversion component includes an analog-to-digital converter (ADC) that converts an analog signal into a digital signal, and a digital-to-analog converter (DAC) that converts a digital signal into an analog signal. In this embodiment of this application, the analog-to-digital conversion component may be disposed in the baseband subsystem, or may be disposed in the radio frequency subsystem.

It should be understood that in this embodiment of this application, the processing core may represent a processor, and the processor may be a general-purpose processor, or may be a processor designed for a specific field. For example, the processor may be a central processing unit (CPU), or may be a digital signal processor (DSP). Alternatively, the processor may be a microcontrol unit (MCU), a graphics processing unit (GPU), an image signal processor (ISP), an audio signal processor (ASP), or a processor specially designed for an artificial intelligence (AI) application. The AI processor includes but is not limited to a neural network processing unit (NPU), a tensor processing unit (TPU), and a processor referred to as an AI engine.

The hardware accelerator may be configured to implement some sub-functions that have relatively high processing overheads, for example, assembly and parsing of a data packet, encryption and decryption of the data packet, and the like. These sub-functions may alternatively be implemented by a processor with a general function. However, if performance or costs are considered, it may be more appropriate to use the hardware accelerator to implement these sub-functions. Therefore, a type of the hardware accelerator and a quantity of hardware accelerators may be selected based on a requirement. In a specific implementation, the hardware accelerator may be implemented by using one or a combination of a field-programmable gate array (FPGA) and an application-specific integrated circuit (ASIC). It is clear that one or more processing cores may also be used in the hardware accelerator.

The memory may be classified into a volatile memory and a non-volatile memory (NVM). The volatile memory is a memory whose stored data is lost after power supply interruption occurs. The volatile memory is mainly a random-access memory (RAM), including a static RAM (SRAM) and a dynamic RAM (DRAM). The non-volatile memory is a memory whose stored data is not lost even if power supply interruption occurs. Common non-volatile memories include a read-only memory (ROM), an optical disc, a magnetic disk, various memories based on a flash memory technology, and the like. Usually, the volatile memory may be selected as the memory, and the non-volatile memory, for example, the magnetic disk or a flash memory, may be selected as the massive storage.

In this embodiment of this application, the baseband subsystem and the radio frequency subsystem jointly form a communications subsystem, to provide a wireless communications function for the wireless communications device. Usually, the baseband subsystem is responsible for managing software and hardware resources of the communications subsystem, and may configure a working parameter of the radio frequency subsystem. The one or more processing cores of the baseband subsystem may be integrated into one or more chips, and the chip may be referred to as a baseband processing chip or a baseband chip. Similarly, the RFIC may be referred to as a radio frequency processing chip or a radio frequency chip. In addition, with evolution of technologies, function division into the radio frequency subsystem and the baseband subsystem in the communications subsystem may alternatively be adjusted. For example, some functions of the radio frequency subsystem are integrated into the baseband subsystem, or some functions of the baseband subsystem are integrated into the radio frequency subsystem. In an actual application, based on a requirement of an application scenario, the wireless communications device may use a combination of different quantities and different types of processing cores.

In this embodiment of this application, the radio frequency subsystem may include an independent antenna, an independent RF front end (RFFE) component, and an independent radio frequency chip. The radio frequency chip is also sometimes referred to as a receiver, a transmitter, or a transceiver. The antenna, the radio frequency front end component, and the radio frequency processing chip can be manufactured and sold independently. It is clear that the radio frequency subsystem may alternatively use different components or different integration manners based on power consumption and performance requirements. For example, some components belonging to the radio frequency front end are integrated into the radio frequency chip, or even both the antenna and the radio frequency front end component are integrated into the radio frequency chip, and the radio frequency chip may also sometimes be referred to as a radio frequency antenna module or an antenna module.

In this embodiment of this application, the baseband subsystem may be used as an independent chip, and the chip may be referred to as a modem chip. A hardware component in the baseband subsystem may be manufactured and sold as a modem chip. The modem chip is also sometimes referred to as a baseband chip or a baseband processor. In addition, the baseband subsystem may further be integrated into an SoC chip, and is manufactured and sold as an SoC chip. Software components of the baseband subsystem may be built in the hardware component before delivery, may be imported from another non-volatile memory into the hardware component after delivery, or may be downloaded and updated in an online manner through a network.

Figure 6:
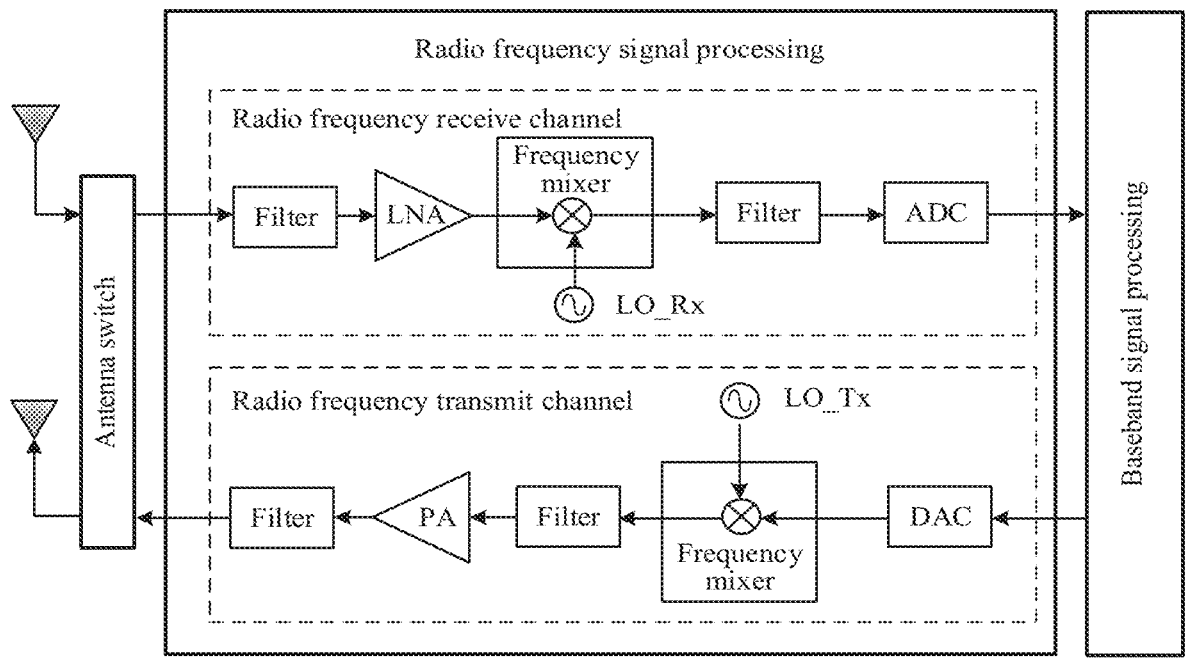
FIG. 6 is a schematic diagram of a structure of another wireless communications device according to an embodiment of this application.

FIG. 6 is a schematic diagram of a structure of another wireless communications device according to an embodiment of this application. FIG. 6 shows some common components used for radio frequency signal processing in the wireless communications device. It should be understood that although FIG. 6 shows only one radio frequency receive channel and one radio frequency transmit channel, the wireless communications device in this embodiment of this application is not limited thereto. The wireless communications device may include one or more radio frequency receive channels and radio frequency transmit channels.

For the radio frequency receive channel, a radio frequency signal received from an antenna is selected by an antenna switch, and sent to the radio frequency receive channel. Because the radio frequency signal received from the antenna is usually very weak, an LNA is usually used to amplify the signal. An amplified signal is first down-converted by a frequency mixer, processed by a filter and an ADC, and finally processed through baseband signal processing. For the radio frequency transmit channel, a baseband signal may be converted into an analog signal by using a DAC. The analog signal is up-converted into a radio frequency signal by the frequency mixer. The radio frequency signal is processed by the filter and a power amplifier PA, selected by the antenna switch, and finally radiated outwards through a proper antenna.

The frequency mixer performs frequency mixing on an input signal and a local oscillator (LO) signal, to implement an up-conversion (corresponding to the radio frequency transmit channel) operation or a down-conversion (corresponding to the radio frequency receive channel) operation. An LO is a common term in the radio frequency field. The local oscillator is also sometimes referred to as a frequency synthesizer. A main function of the local oscillator or the frequency synthesizer is to provide a specific frequency required for radio frequency processing, for example, a frequency of a carrier. A higher frequency may be implemented by using a device such as a phase-locked loop (PLL) or a delay-locked loop (DLL). A lower frequency may be implemented by directly using a crystal oscillator or by performing frequency division on a high-frequency signal generated by a device such as the PLL.

For an SRS switching operation, when a terminal switches from one carrier to another carrier, because a frequency of a carrier changes, a frequency to which the radio frequency transmit channel is adapted also needs to be adjusted. In the example in FIG. 4, when the terminal sends data on the CC 1 in the symbol 0 and the symbol 1, the local oscillator of the radio frequency transmit channel may be set to a frequency of the CC 1. When the terminal sends an SRS on the CC 2 in the symbol 3, the local oscillator of the radio frequency transmit channel may be set to a frequency of the CC 2. Because the frequency of the CC 1 is different from the frequency of the CC 2, a frequency of the local oscillator of the radio frequency transmit channel may need to be readjusted. It takes specific time to readjust the frequency of the local oscillator, for example, PLL stabilization time, which is an important part of radio frequency retuning time. In the example in FIG. 4, if the terminal needs to complete carrier switching in the symbol 2, the radio frequency retuning time should be less than or equal to a length of the symbol 2. If the radio frequency retuning time is greater than the length of the symbol 2, to ensure SRS transmission on the CC 2, the terminal has to start carrier switching before the symbol 2, and this affects data transmission in the symbol 1, and causes interruption of data transmission on the CC 1 for longer time. Therefore, reducing the radio frequency retuning time in the SRS switching operation is significant for improving system performance.

Figure 7A:
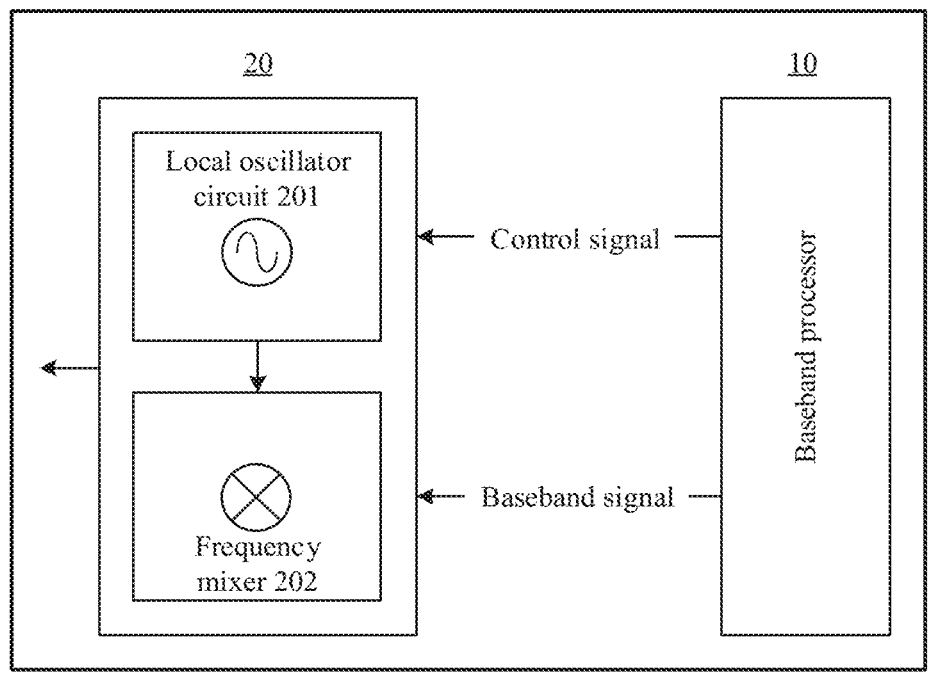
FIG. 7A is a schematic diagram of a structure of still another wireless communications device according to an embodiment of this application.

FIG. 7A is a schematic diagram of a structure of still another wireless communications device according to an embodiment of this application. The wireless communications device may be configured to perform the SRS switching operation in the embodiments of this application. As shown in FIG. 7A, the wireless communications device includes a baseband processor 10 and a radio frequency processor 20. The radio frequency processor 20 may further include a local oscillator circuit 201 and a frequency mixer 202. The baseband processor 10 may provide a baseband signal and a control signal for the radio frequency processor 20, to configure some working parameters required by the radio frequency processor 20, especially some working parameters required by the local oscillator circuit 201. The frequency mixer 202 may receive the baseband signal from the baseband processor and a local oscillator signal from the local oscillator circuit 201, to perform an up-conversion operation.

It should be noted that in this embodiment of this application, the control signal provided by the baseband processor 10 for the local oscillator circuit 201 may be used to enable the local oscillator circuit 201 to provide one or more stable local oscillator signals in a carrier switching process, to reduce radio frequency retuning time required for carrier switching, for example, PLL stabilization time, so as to improve performance of a wireless communications system.

It should be understood that the technical solution provided in this embodiment of this application is applicable to switching between a plurality of carriers. For ease of description, the following uses a first carrier and a second carrier as an example for description. The first carrier and the second carrier may be used as an example of a plurality of carriers in a scenario of carrier aggregation or carrier switching of a same base station, or may be used as an example of a plurality of carriers in a scenario of dual connectivity of a plurality of base stations. In addition, signals transmitted on the first carrier and the second carrier may be SRS signals, or may be other reference signals, or signals indicating control information or user data.

For ease of description, the following provides description by using a first SRS and a second SRS as an example. Further, it is assumed that in an SRS carrier switching process, a terminal sends the first SRS on the first carrier in a first time period, and then sends the second SRS on the second carrier in a second time period. In an intermediate time period between the first time period and the second time period, the terminal switches from the first carrier to the second carrier, and duration of the intermediate time period depends on duration of the radio frequency retuning time.

In an optional implementation solution, the local oscillator circuit 201 may include a plurality of local oscillators LOs, and each of the plurality of LOs may provide a stable LO signal. In the SRS carrier switching process, the control signal provided by the baseband processor 10 for the local oscillator circuit 201 may be used to control the local oscillator circuit 201 to select a proper and stable LO signal from the plurality of LO signals and output the signal to the frequency mixer 202. For example, in the SRS carrier switching process, the control signal provided by the baseband processor 10 for the local oscillator circuit 201 may be used to enable the local oscillator circuit 201 to provide a stable LO signal required by the first carrier in the first time period, select another stable LO signal from another LO in the intermediate time period, and provide another stable LO signal required by the second carrier in the second time period. In the optional implementation solution, because the local oscillator circuit 201 uses the plurality of LOs, LO signal stabilization time caused by switching a frequency of the LO can be reduced. This reduces the duration of the intermediate time period, and reduces the radio frequency retuning time required for SRS carrier switching.

Figure 7B:
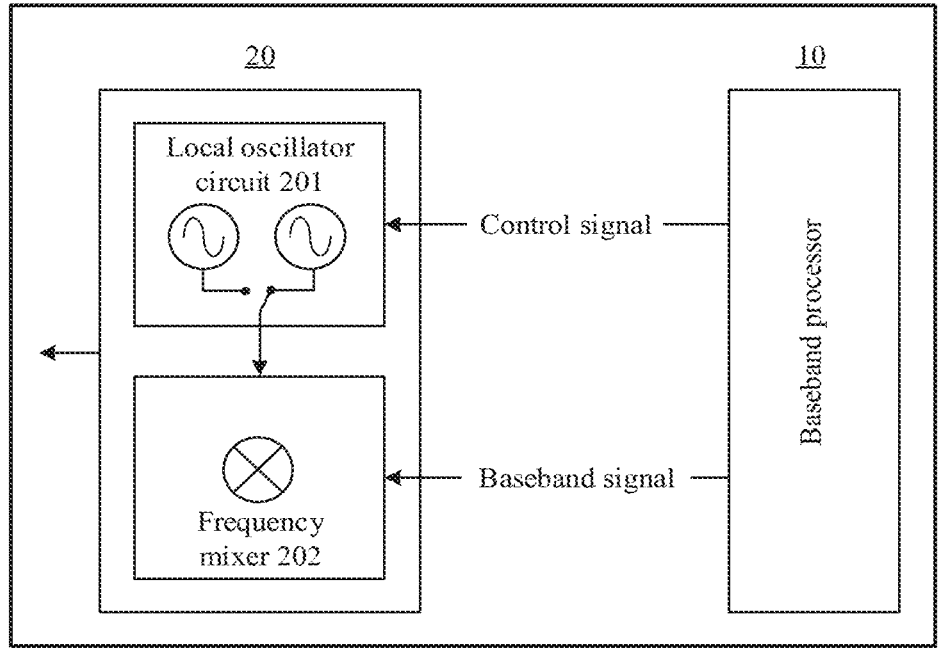
FIG. 7B is a schematic diagram of a structure of a wireless communications device according to an embodiment of this application.

FIG. 7B is a schematic diagram of a structure of a wireless communications device according to an embodiment of this application. FIG. 7B is a schematic diagram that shows a structure of the radio frequency processor 20. In the radio frequency processor 20 shown in FIG. 7B, the local oscillator circuit 201 includes a plurality of local oscillators and one single-pole multiple-throw switch, and receives the control signal from the baseband processor 10. The control signal may enable the local oscillator circuit 201 to output a stable LO signal required by the first carrier in the first time period, and output another stable LO signal required by the second carrier in the second time period. For example, the control signal may include a switch control instruction of the local oscillator circuit 201, used to control the single-pole multi-throw switch to output a proper LO signal. It should be understood that the single-pole multiple-throw switch in the local oscillator circuit 201 is only an implementation to implement selective gating of a plurality of stable LO signals. The local oscillator circuit 201 may alternatively include another component configured to gate an LO signal, for example, a multiplexer (MUX).

In another optional implementation solution, the local oscillator circuit 201 may include at least one LO. In addition, the wireless communications device may further include at least one digital frequency converter, and the digital frequency converter may be disposed in the baseband processor 10 or the radio frequency processor 20. The digital frequency converter may be configured to perform a frequency conversion operation on a digital signal (for example, a digital baseband signal). Compared with an analog frequency conversion operation provided by a frequency mixer, a digital frequency conversion provided by the digital frequency converter may have a relatively small range, but the frequency conversion operation requires less time. In a specific implementation, the digital frequency conversion operation may include a frequency shifting operation, for example, multiplying a to-be-transmitted digital baseband signal and a preset frequency offset or a phase offset, to obtain a digital frequency conversion signal. A frequency of the digital frequency conversion signal has a specific offset in frequency domain relative to the digital baseband signal. In addition, the digital frequency conversion operation may further include signal bandwidth adjustment. Further, this may be implemented by changing a sampling rate of a signal.

In the SRS carrier switching process, the control signal provided by the baseband processor 10 for the local oscillator circuit 201 may be used to enable the local oscillator circuit 201 to provide, by using a same LO, stable LO signals at a same frequency for the first carrier and the second carrier. In addition, the frequency conversion operation provided by the digital frequency converter may compensate for a frequency difference between the first carrier and the second carrier. For example, a sum of a frequency of a first digital frequency conversion signal output by the digital frequency converter and a frequency of the LO signal is equal to a frequency of the first carrier, and a sum of a frequency of a second digital frequency conversion signal output by the digital frequency converter and the frequency of the LO signal is equal to a frequency of the second carrier. The first digital frequency conversion signal corresponds to a first SRS to be transmitted on the first carrier, and the second digital frequency conversion signal corresponds to a second SRS to be transmitted on the second carrier.

In the SRS carrier switching process, the control signal provided by the baseband processor 10 for the local oscillator circuit 201 may be used to enable the local oscillator circuit 201 to provide a stable LO signal required by the first carrier in the first time period, and provide stable LO signals at a same frequency required by the second carrier in the second time period. In the intermediate time period between the first time period and the second time period, the digital frequency converter may be adjusted accordingly, to compensate for the frequency difference between the first carrier and the second carrier. In the SRS carrier switching process, frequencies of LO signals provided by a same LO do not need to be adjusted, and the digital frequency conversion operation requires relatively short time. Therefore, this reduces duration of the second time period, and reduces the radio frequency retuning time required for SRS carrier switching.

Figure 7C:
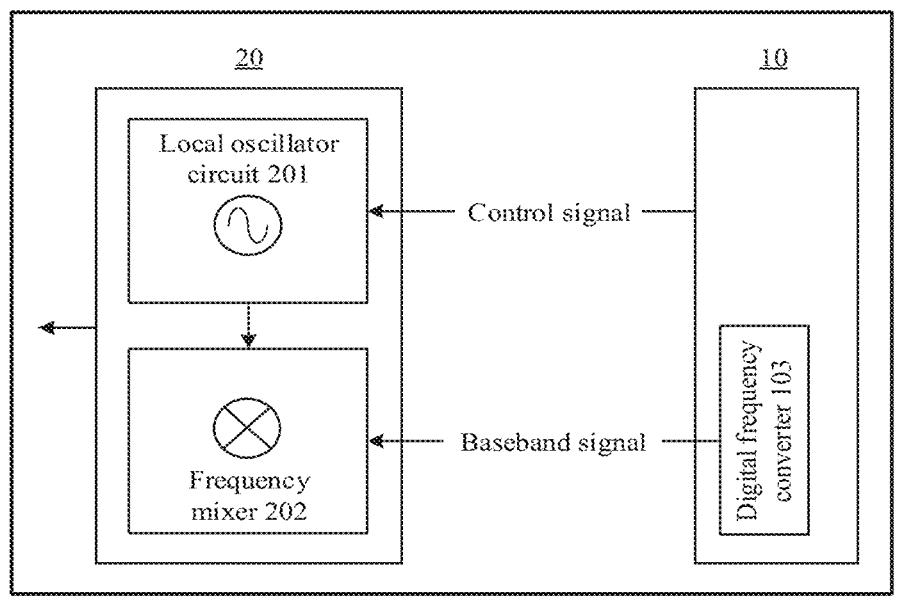
FIG. 7C is a schematic diagram of a structure of another wireless communications device according to an embodiment of this application.

FIG. 7C is a schematic diagram of a structure of another wireless communications device according to an embodiment of this application. In FIG. 7C, the baseband processor 10 includes a digital frequency converter 103. The local oscillator circuit 201 in the radio frequency processor 20 may receive the control signal from the baseband processor 10. The control signal may enable the local oscillator circuit 201 to output a stable LO signal in the first time period and the second time period. In addition, the digital frequency converter 103 in the baseband processor 10 performs first digital frequency conversion processing on a digital baseband signal corresponding to the first SRS in the first time period, adjusts a working parameter of the digital frequency converter in the intermediate time period, to compensate for the frequency difference between the first carrier and the second carrier, and performs second digital frequency conversion processing on a digital baseband signal corresponding to the second SRS in the second time period.

Figure 7D:
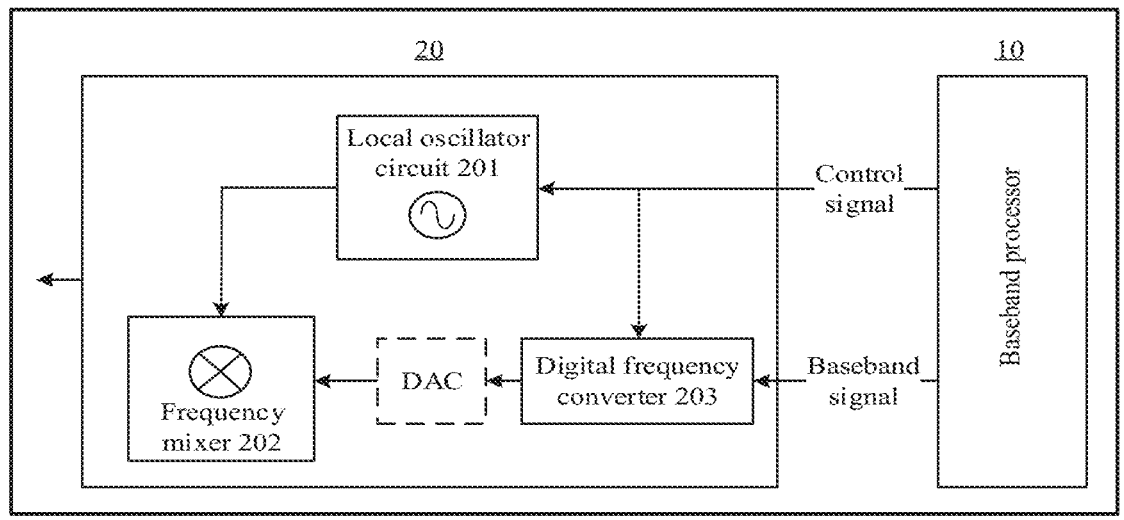
FIG. 7D is a schematic diagram of a structure of still another wireless communications device according to an embodiment of this application.

FIG. 7D is a schematic diagram of a structure of still another wireless communications device according to an embodiment of this application. FIG. 7D is a schematic diagram that shows another structure of the radio frequency processor 20. Compared with the digital frequency converter 103 included in the baseband processor 10 in FIG. 7C, a digital frequency converter 203 in FIG. 7D is included in the radio frequency processor 20, to reduce data transmission overheads between the baseband processor 10 and the radio frequency processor 20, and reduce power consumption.

In FIG. 7D, in addition to the local oscillator circuit 201 and the frequency mixer 202, the radio frequency processor 20 further includes the digital frequency converter 203. There may be another component between the digital frequency converter 203 and the frequency mixer 202, for example, a DAC. The local oscillator circuit 201 and the digital frequency converter 203 may receive the control signal from the baseband processor 10. The control signal may enable the local oscillator circuit 201 to output a stable LO signal in the first time period and the second time period. In addition, the control signal may further enable the digital frequency converter 203 to perform first digital frequency conversion processing on the digital baseband signal corresponding to the first SRS in the first time period, adjust the working parameter of the digital frequency converter in the intermediate time period, to compensate for the frequency difference between the first carrier and the second carrier, and perform second digital frequency conversion processing on the digital baseband signal corresponding to the second SRS in the second time period.

In another optional implementation solution, the wireless communications device may alternatively implement the up-conversion operation only through the digital frequency conversion operation provided by the digital frequency converter. However, this solution has relatively high requirements on the digital frequency converter and another component in the wireless communications device, for example, a frequency conversion range of the digital frequency converter and a bandwidth processing capability of the component in the wireless communications device. Therefore, due to a limited capability of the wireless communications device, this solution may be more suitable for a scenario in which absolute frequencies of the first carrier and the second carrier are relatively low, and the frequency difference between the two carriers is relatively small.

Figure 8:
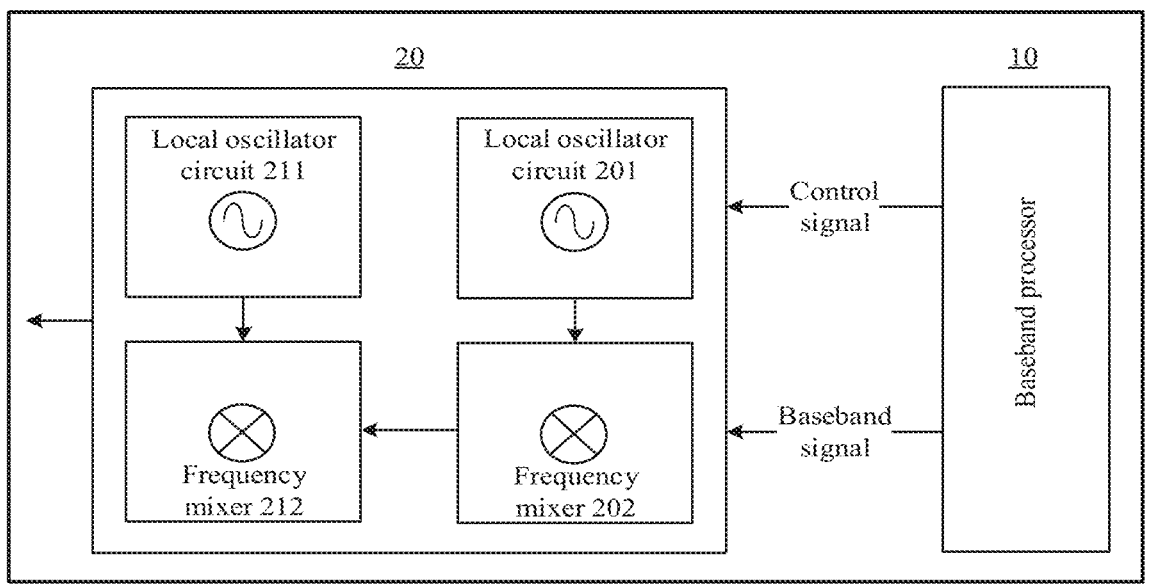
FIG. 8 is a schematic diagram of a structure of a wireless communications device according to an embodiment of this application.

FIG. 8 is a schematic diagram of a structure of a wireless communications device according to an embodiment of this application. The wireless communications device may be configured to perform the SRS switching operation in the embodiments of this application, especially an SRS switching operation in an NR high frequency band. As shown in FIG. 8, the wireless communications device includes the baseband processor 10 and the radio frequency processor 20. The radio frequency processor 20 may use a multi-stage frequency mixing solution, and may include the local oscillator circuit 201 and the frequency mixer 202 that are configured to perform a first-stage frequency mixing operation, and a local oscillator circuit 211 and a frequency mixer 212 that are configured to perform a second-stage frequency mixing operation. The baseband processor 10 may provide the baseband signal for the radio frequency processor 20, and may further provide the control signal to configure some working parameters required by the radio frequency processor 20. The frequency mixer 202 may receive the baseband signal from the baseband processor and a first local oscillator signal from the local oscillator circuit 201, to perform a first up-conversion operation, and output an intermediate frequency signal. The frequency mixer 212 may receive the intermediate frequency signal from the frequency mixer 202 and a second local oscillator signal from the local oscillator circuit 211, to perform a second up-conversion operation.

Because a frequency of the NR high frequency band is relatively high, for example, more than 26 gigahertz (GHz), the SRS switching operation in the NR high frequency band is difficult to implement by using a conventional stage-1 frequency mixing solution with a zero intermediate frequency architecture. The wireless communications device shown in FIG. 8 uses a multi-stage frequency mixing solution. This helps reduce implementation difficulty. It should be understood that several optional implementation solutions of the wireless communications device shown in FIG. 7B to FIG. 7D are also applicable to the multi-stage frequency mixing solution shown in FIG. 8. For related content, refer to the description of the foregoing embodiments. Details are not described herein again.

Figure 9:
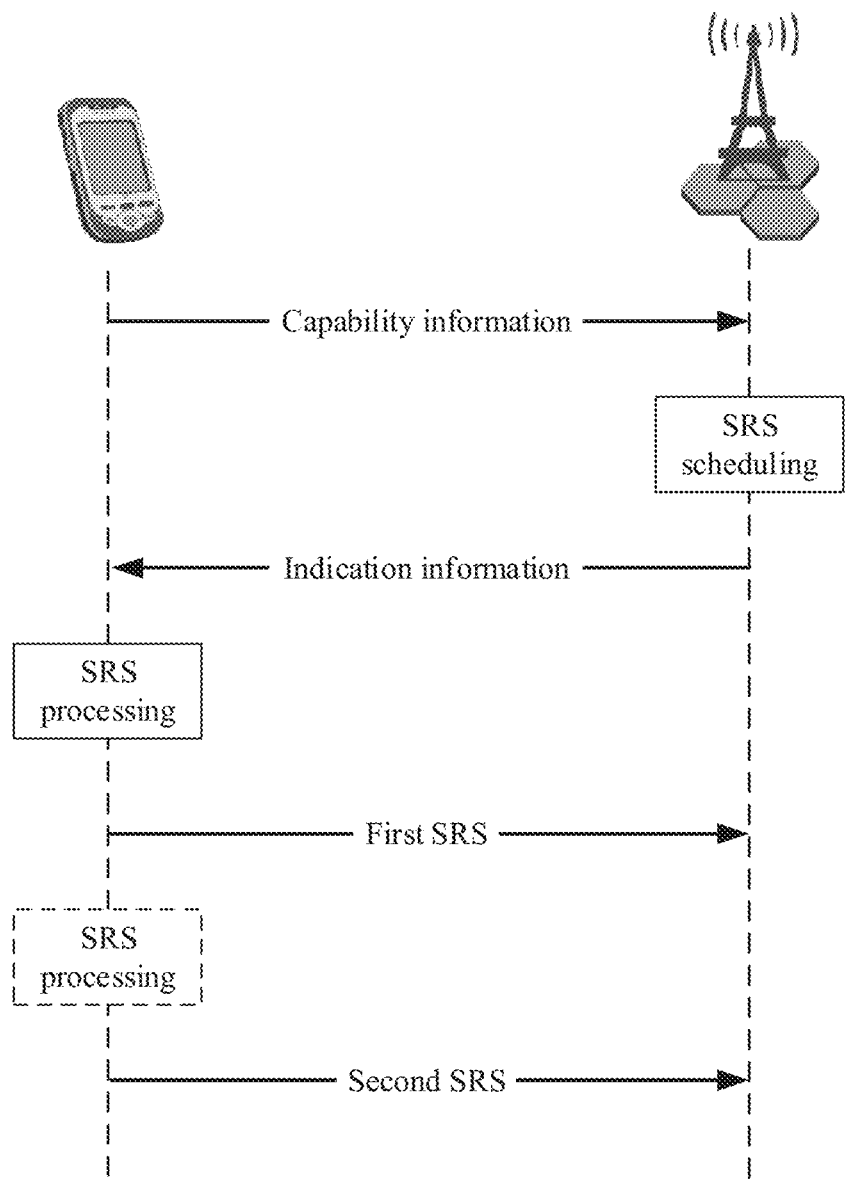
FIG. 9 is a schematic flowchart of an SRS sending method according to an embodiment of this application.

FIG. 9 is a schematic flowchart of an SRS sending method according to an embodiment of this application. The method may be performed by the wireless communications device (for example, the terminal) in the foregoing technical solution. As shown in FIG. 9, the method may include the following steps.

Step 1: The terminal accesses a base station, and reports capability information of the terminal to the base station.

Correspondingly, after receiving the capability information reported by the terminal, the base station may configure a carrier set, for example, the first carrier set and the second carrier set in the embodiment shown in FIG. 3, for the terminal based on the capability information of the terminal, for example, frequencies and bandwidth of the carriers in the first carrier set and the second carrier set. The bandwidth may be a bandwidth part (BWP) of an NR system. Then, the base station may further perform SRS scheduling, and send indication information to the terminal, to indicate an SRS scheduling result. The indication information includes information such as a time-frequency resource and an antenna port used to transmit an SRS.

The indication information may be carried in one or more downlink messages. The downlink message may include a Radio Resource Control (RRC) message, for example, an RRC connection setup message or an RRC reconfiguration message. Alternatively, the indication information may be carried in a control element (CE) of media access control (MAC), or carried in downlink control information (DCI).

Step 2: The terminal receives the indication information from the base station.

The indication information may be used to indicate the terminal to sequentially send SRSs to the base station on a first carrier and a second carrier. For example, the indication information may include the first carrier on which a first SRS is transmitted, a first time period in which the first SRS is transmitted, the second carrier on which a second SRS is transmitted, and a second time period in which the second SRS is transmitted.

After receiving the indication information, the terminal needs to perform corresponding SRS processing, to send the first SRS on the first carrier in the first time period, and send the second SRS on the second carrier in the second time period. An operation related to SRS processing may include the analog frequency mixing operation and/or the digital frequency conversion operation in the foregoing solution.

In an actual application, SRS processing performed by the terminal is related to a capability of the terminal on one hand, and also related to configurations of the first carrier and the second carrier on the other hand. The terminal may independently select to use an analog frequency mixing operation (for example, a scenario shown in FIG. 7B), a digital frequency conversion operation (for example, a scenario in which a frequency of a carrier is relatively low), or a combination of a digital frequency conversion operation and an analog frequency conversion operation (for example, scenarios shown in FIG. 7C and FIG. 7D). Therefore, SRS processing performed by the terminal may further include a determining operation of the terminal, for example, determining frequency locations of the first carrier and the second carrier, and bandwidth ranges of the first carrier and the second carrier.

For example, when determining that the first carrier and the second carrier belong to a same frequency band in the 3GPP technical specification, the terminal may select to use the combination of the digital frequency conversion operation and the analog frequency conversion operation. The analog frequency conversion operation shares local oscillator signals at a same frequency, and the digital frequency conversion operation is used to compensate for a frequency difference between the first carrier and the second carrier. Further, when the terminal determines that the two carriers on which the SRSs are sequentially sent belong to TDD intra-band contiguous downlink carrier aggregation, and an uplink bandwidth processing capability of the terminal is greater than or equal to bandwidth of the downlink carrier aggregation, the local oscillator signals at the same frequency that are shared by the analog frequency conversion operation may be local oscillator signals used for the downlink carrier aggregation.

Step 3: The terminal sends the first SRS to the base station on the first carrier in the first time period.

It should be understood that in an intermediate time period between the first time period and the second time period, the terminal may also perform SRS processing, especially on the second SRS to be transmitted on the second carrier. The SRS processing includes the digital frequency conversion operation and/or the analog frequency conversion operation. For SRS processing, refer to the foregoing description. Details are not described herein again.

Step 4: The terminal sends the second SRS to the base station on the second carrier in the second time period.

Then, the base station may respectively estimate channel quality of the first carrier and the second carrier based on the received first SRS and the received second SRS, to facilitate subsequent data scheduling. For example, the base station may subsequently configure the first carrier and the second carrier to participate in carrier aggregation, or select one of the carriers with better channel quality to perform subsequent data transmission.

In the embodiments of this application and the accompanying drawings, the terms "first", "second", "third", and the like are intended to distinguish between similar objects but do not necessarily indicate a specific order or sequence. In addition, the terms "include", "have", and any variant thereof are intended to indicate non-exclusive inclusion, for example, include a series of steps or units. Methods, systems, products, or devices are not necessarily limited to those steps or units that are literally listed, but may include other steps or units that are not literally listed or that are inherent to such processes, methods, products, or devices.

It should be understood that in this application, "at least one" means one or more, and "a plurality of" means two or more. The term "and/or" is used to describe an association relationship between associated objects, and represents that three relationships may exist. For example, "A and/or B" may represent the following three cases: only A exists, only B exists, and both A and B exist, where A and B may be singular or plural. The character "/" usually indicates an "or" relationship between the associated objects. The term "at least one of the following" or a similar expression thereof means any combination of the items, including any combination of singular items (pieces) or plural items (pieces). For example, at least one (piece) of a, b, or c may represent: a, b, c, "a and b", "a and c", "b and c", or "a, b, and c", where a, b, and c may be singular or plural.

It should be understood that sequence numbers of the foregoing processes do not mean an execution sequence in this application. The execution sequence of the processes should be determined based on functions and internal logic of the processes, and should not be construed as any limitation on the implementation processes of the embodiments of this application. The term "couple" mentioned in this application is used to express interworking or mutual interaction between different components, and may include a direct connection or an indirect connection by using another component.

All or some of the foregoing embodiments of this application may be implemented by using software, hardware, firmware, or any combination thereof. When the software is used to implement the embodiments, all or some of the embodiments may be implemented in a form of a computer program product. The computer program product includes one or more computer program code or computer program instructions. When the computer program instructions are loaded and executed on a computer, the procedures or functions according to the embodiments of this application are all or partially generated. The computer may be a general-purpose computer, a special-purpose computer, a computer network, or another programmable apparatus.

The computer program code or the computer program instructions may be stored in a computer-readable storage medium or may be transmitted from a computer-readable storage medium to another computer-readable storage medium. For example, the computer program code or the computer program instructions may be transmitted from a website, computer, server, or data center to another web site, computer, server, or data center in a wired (for example, a coaxial cable or an optical fiber) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium, for example, a floppy disk, a hard disk, and a magnetic tape, or may be an optical medium, for example, a DIGITAL VERSATILE DISC (DVD), or may be a semiconductor medium, for example, a solid-state disk (SSD).

The foregoing descriptions are merely specific implementations of this application, but the protection scope of this application is not limited thereto. Any variation or replacement that can be readily figured out by a person skilled in the art within the technical scope disclosed in this application shall fall within the protection scope of this application. Therefore, the protection scope of this application shall be subject to the protection scope of the claims.

The invention claimed is:

1. A wireless communications apparatus, comprising:
a local oscillator circuit configured to output first local oscillator signals;
a digital frequency converter configured to:
perform a digital frequency conversion operation on a to-be-transmitted signal to obtain a digital frequency conversion signal, wherein the digital frequency conversion signal comprises a first digital frequency conversion signal corresponding to a first sounding reference signal (SRS) to be transmitted on a first carrier in a first time period and a second digital frequency conversion signal corresponding to a second SRS to be transmitted on a second carrier in a second time period, wherein the digital frequency converter is adjusted in an intermediate time period between the first time period and the second time period; and
output the digital frequency conversion signal; and
a frequency mixer coupled to the local oscillator circuit and the digital frequency converter and configured to:
sequentially receive the first digital frequency conversion signal and the second digital frequency conversion signal; and
respectively perform analog frequency conversion operations on the first digital frequency conversion signal and the second digital frequency conversion signal based on the first local oscillator signals at a first frequency to transmit the first SRS on the first carrier during the first time period and to transmit the second SRS on the second carrier during the second time period,
wherein the second time period is later than the first time period.

2. The wireless communications apparatus of claim 1, wherein a sum of a frequency of the first digital frequency conversion signal and a frequency of each of the first local oscillator signals is equal to a frequency of the first carrier, and wherein a sum of a frequency of the second digital frequency conversion signal and the frequency of each of the first local oscillator signals is equal to a frequency of the second carrier.

3. The wireless communications apparatus of claim 1, wherein a frequency of each of the first local oscillator signals is between a frequency of the first carrier and a frequency of the second carrier.

4. The wireless communications apparatus of claim 1, wherein the first carrier and the second carrier are located in a same frequency band.

5. The wireless communications apparatus of claim 4, wherein both the first carrier and the second carrier are time-division duplex (TDD) carriers and are configured for TDD intra-band contiguous downlink carrier aggregation.

6. The wireless communications apparatus of claim 5, wherein a frequency of each of the first local oscillator signals is equal to a center frequency of the TDD intra-band contiguous downlink carrier aggregation of the first carrier and the second carrier.

7. The wireless communications apparatus of claim 1, wherein both the first carrier and the second carrier are in a frequency range 2 of a 3rd Generation Partnership Project (3GPP) New Radio (NR) technical specification.

8. The wireless communications apparatus of claim 7, wherein the local oscillator circuit comprises:
a first local oscillator configured to output second local oscillator signals; and a second local oscillator configured to output third local oscillator signals, and wherein the frequency mixer comprises:
  a first frequency mixer configured to:
    sequentially receive the first digital frequency conversion signal and the second digital frequency conversion signal;
    respectively perform first up-conversion operations on the first digital frequency conversion signal and the second digital frequency conversion signal based on the second local oscillator signals at a second frequency to obtain a first intermediate frequency signal and a second intermediate frequency signal; and
    output the first intermediate frequency signal and the second intermediate frequency signal; and
  a second frequency mixer configured to:
    sequentially receive the first intermediate frequency signal and the second intermediate frequency signal;
    respectively perform second up-conversion operations on the first intermediate frequency signal and the second intermediate frequency signal based on the third local oscillator signals at a third frequency to transmit the first SRS on the first carrier during the first time period and to transmit the second SRS on the second carrier during the second time period.

9. The wireless communications apparatus of claim 1, further comprising an integrated circuit chip, wherein the integrated circuit chip comprises the local oscillator circuit, the digital frequency converter, and the frequency mixer.

10. The wireless communications apparatus of claim 1, further comprising a first integrated circuit chip, a second integrated circuit chip, and a baseband processor, wherein the baseband processor and the digital frequency converter are integrated into the first integrated circuit chip, and wherein the local oscillator circuit and the frequency mixer are integrated into the second integrated circuit chip.

11. A sounding reference signal (SRS) sending method, comprising:
  performing a digital frequency conversion operation on a to-be-transmitted signal to obtain a digital frequency conversion signal, wherein the digital frequency conversion signal comprises a first digital frequency conversion signal corresponding to a first sounding reference signal (SRS) to be transmitted on a first carrier in a first time period and a second digital frequency conversion signal corresponding to a second SRS to be transmitted on a second carrier in a second time period, wherein the digital frequency converter is adjusted in an intermediate time period between the first time period and the second time period;
  sequentially performing analog frequency conversion operations on the first digital frequency conversion signal and the second digital frequency conversion signal based on local oscillator signals at a same frequency;
  transmitting the first SRS on the first carrier during the first time period; and
  transmitting the second SRS on the second carrier during the second time period,
  wherein the second time period is later than the first time period,
  wherein a sum of a frequency of the first digital frequency conversion signal and a frequency of each of the local oscillator signals is equal to a frequency of the first carrier, and
  wherein a sum of a frequency of the second digital frequency conversion signal and the frequency of each of the local oscillator signals is equal to a frequency of the second carrier.

12. The SRS sending method of claim 11, wherein the frequency of each of the local oscillator signals is between the frequency of the first carrier and the frequency of the second carrier.

13. The SRS sending method of claim 11, wherein both the first carrier and the second carrier are time-division duplex (TDD) carriers that are located in a same frequency band and are configured for TDD intra-band contiguous downlink carrier aggregation.

14. The SRS sending method of claim 13, wherein the frequency of each of the local oscillator signals is equal to a center frequency of the TDD intra-band contiguous downlink carrier aggregation of the first carrier and the second carrier.

15. The SRS sending method of claim 11, wherein both the first carrier and the second carrier are in a frequency range 2 of the 3rd Generation Partnership Project (3GPP) New Radio (NR) technical specification.

16. The SRS sending method of claim 15, wherein the analog frequency conversion operations comprise analog up-conversion operations of two stages, wherein the local oscillator signals comprise a first local oscillator signal and a second local oscillator signal, wherein the first local oscillator signal is for a first-stage analog up-conversion operation, and wherein the second local oscillator signal is for a second-stage analog up-conversion operation.

17. The SRS sending method of claim 11, further comprising receiving, from a base station, indication information indicating the first carrier, the first time period, the second carrier, and the second time period.

18. A sounding reference signal (SRS) sending apparatus, comprising:
  a memory configured to store program instructions; and
  a processor coupled to the memory and configured to execute the program instructions to cause the SRS sending apparatus to:
    perform a digital frequency conversion operation on a to-be-transmitted signal to obtain a digital frequency conversion signal, wherein the digital frequency conversion signal comprises a first digital frequency conversion signal corresponding to a first sounding reference signal (SRS) to be transmitted on a first carrier in a first time period and a second digital frequency conversion signal corresponding to a second SRS to be transmitted on a second carrier in a second time period, wherein the digital frequency converter is adjusted in an intermediate time period between the first time period and the second time period;
    sequentially perform analog frequency conversion operations on the first digital frequency conversion signal and the second digital frequency conversion signal based on local oscillator signals with a same frequency;
    transmit the first SRS on the first carrier during the first time period; and
    transmit the second SRS on the second carrier in the second time period, wherein the second time period is later than the first time period, wherein a sum of a frequency of the first digital frequency conversion signal and a frequency of each of the local oscillator signals is equal to a frequency of the first carrier, and wherein a sum of a frequency of the second digital frequency conversion signal and the frequency of each of the local oscillator signals is equal to a frequency of the second carrier.

19. The SRS sending apparatus of claim 18, wherein the frequency of each of the local oscillator signals is between the frequency of the first carrier and the frequency of the second carrier.

20. The SRS sending apparatus of claim 18, wherein both the first carrier and the second carrier are time-division duplex (TDD) carriers that are located in a same frequency band and are configured for TDD intra-band contiguous downlink carrier aggregation.

* * * * *